United States Patent
Fujikata et al.

[11] Patent Number: 6,083,632
[45] Date of Patent: Jul. 4, 2000

[54] MAGNETORESISTIVE EFFECT FILM AND METHOD OF MANUFACTURE THEREOF

[75] Inventors: Junichi Fujikata; Masafumi Nakada, both of Tokyo, Japan

[73] Assignee: NEC Corporation, Tokyo, Japan

[21] Appl. No.: 09/004,066

[22] Filed: Jan. 8, 1998

[30] Foreign Application Priority Data

Jan. 8, 1997 [JP] Japan .................................. 9-001386

[51] Int. Cl.⁷ ...................................................... G11B 5/66
[52] U.S. Cl. ...................... 428/611; 428/622; 428/629; 428/632; 428/660; 428/667; 428/678; 428/692; 428/694 R; 428/694 T; 428/694 TS; 428/694 TM; 428/900; 427/128; 427/129; 427/130
[58] Field of Search .................................... 428/611, 622, 428/629, 632, 660, 667, 678, 694 R, 692, 694 T, 694 TS, 694 TM, 900; 427/128–130

[56] References Cited

U.S. PATENT DOCUMENTS 5,549,978  8/1996  Iwasaki .................... 428/692

FOREIGN PATENT DOCUMENTS

| 4-358310 | 12/1992 | Japan . |
| 5-347013 | 12/1993 | Japan . |
| 7-94326 | 4/1995 | Japan . |
| 7-202292 | 8/1995 | Japan . |
| 8-83937 | 3/1996 | Japan . |
| 8-127864 | 5/1996 | Japan . |
| 8-138935 | 5/1996 | Japan . |
| 8-167120 | 6/1996 | Japan . |
| 8-204253 | 8/1996 | Japan . |
| 9-50611 | 2/1997 | Japan . |
| 9-50612 | 2/1997 | Japan . |

*Primary Examiner*—Leszek Kiliman
*Attorney, Agent, or Firm*—Young & Thompson

[57] ABSTRACT

A magnetoresistive effect film is formed by laminating a plurality of magnetic thin films onto a substrate with an intervening non-magnetic thin film, an antiferromagnetic thin film being provided so as to neighbor to one of the ferromagnetic thin film via this intervening non-magnetic thin film. With the bias magnetic field applied to the antiferromagnetic thin film being Hr and the coercivity of the other ferromagnetic thin film being $Hc_2$, the condition $Hc_2 < Hr$ is satisfied. The antiferromagnetic thin film is made of either a cobalt oxide, a nickel oxide, or an a-phase ion oxide, or of an alloy of two or more of these materials, this being formed as a two-layer film.

6 Claims, 14 Drawing Sheets

MAGNETORESISTIVE EFFECT FILM AND METHOD OF MANUFACTURE THEREOF

BACKGROUND OF THE INVENTION

1. Field of the Invention

The present invention relates to magnetoresistive effect element for the purpose of reading a magnetic field strength in a magnetic medium or the like as a signal, and to a manufacturing method therefor. More specifically, it relates to a magnetoresistive effect film having a large resistance change ratio in a small externally applied magnetic field.

2. Description of Related Art

In the past, there have been disclosures of magnetic reading transducers known as magnetoresistive (MR) sensors or MR heads, and it has been known that these can be used to read data from a magnetic surface with a large linear density. Such an MR sensor performs detection of a magnetic field signal via a change of resistance, which is a function of the magnetic flux-strength and direction as sensed by the reading element.

In an MR sensor such as this in the past, one component of the resistance of the reading element changed in proportion to the square of the cosine of the angle formed between the direction of the magnetization and the detection current flowing in the element, according to an operating principle known as the anisotropic magnetoresistance (AMR) effect.

The AMR effect is discussed in detail in D. A. Thompson et al "Memory, Storage, and Related Applications" IEEE Transactions of Magnetics. MAG-11, p. 1039 (1975).

Additionally, there has recently been a report of a more prominent magnetoresistive effect, whereby the resistance change in a laminated magnetic sensor is attributed to spin dependency transmission between magnetic layers with an intervening non-magnetic layer, and to accompanying spin dependency dispersion at the layer boundary.

This magnetoresistive effect is known by a variety of names, including "giant magnetoresistive effect" and "spin valve effect." A magnetoresistive sensor such as this is made from an appropriate material, and provides an improvement in sensitivity in magnetic field and an increase in resistance change when compared to observation by a sensor which uses the AMR effect.

With this type of MR sensor, the internal planar resistance between a pair of antiferromagnetic layers that are separated by a non-magnetic layer varies in proportion to the cosine of the angle formed between the magnetization directions in the two layers.

In the Japanese Unexamined Patent Publication (KOKAI) No. 2-61572, there is a description of a laminated magnetic structure which brings about a large MR effect, that occurs by means of anti-parallel orientation of the magnetization between the magnetic layers.

In the above-noted Japanese unexamined patent application publication, transition metals and alloys thereof are cited as materials that can be used in the magnetic layers in this laminated structure. There is a disclosure that FeMn is suitable for use as at least one of two magnetic layers that are separated by a center layer.

In the Japanese Unexamined Patent Publication (KOKAI) No. 4-358310, there is a disclosure of an MR sensor having a two layers of thin film ferromagnetic material which are separated by a non-magnetic metallic thin film, in which when the applied magnetic field is zero the magnetization directions in the two ferromagnetic thin films are mutually perpendicular, the resistance between the two non-coupled ferromagnetic layers varying in proportion to the cosine of the angle formed between the magnetization directions in the two layers, this being independent of direction of current flow in the sensor.

In the Japanese Unexamined Patent Publication (KOKAI) No. 6-214837, there is disclosure of magnetoresistive effect element in which, onto a substrate a plurality of magnetic thin films are laminated via an intervening non-magnetic layer, so that one of soft magnetic thin films neighbouring to each other via an intervening non-magnetic thin film, is adjacent to an antiferromagnetic thin film, wherein in the magnetoresistive effect film in which the bias magnetic field on this antiferromagnetic thin film is Hr and the coercivity of the soft magnetic thin film is $Hc_2<Hr$, the above-noted antiferromagnetic thin film is a super lattice selected as at least two types from the group consisting of NiO, NixCo1-x, and CoO.

Additionally, in the Japanese Unexamined Patent Publication (KOKAI) No. 7-136670, in a magnetoresistive effect film having the same structure as in the Japanese Unexamined Patent Publication (KOKAI) No. 6-214837, there is a disclosure of a magnetoresistive effect element that is a two-layer film wherein onto a antiferromagnetic thin film of NiO, is laminated a layer of CoO to a thickness of 10 to 40 Å.

However, in a magnetoresistive effect element such as described above, although operation is by means of a small external magnetic field, a practically usable sensor or magnetic head must have a signal magnetic field applied in the direction of its easy magnetization axis, this leading to the problems that, for use as a sensor, there is no change in resistance exhibited in the area of a zero magnetic field, and that there is non-linearity occurring due to effects such as the Barkhausen jump.

Additionally, there is ferromagnetic interaction between a magnetic layers which neighbor one another via an intervening non-magnetic layer, causing the problem of a shift of the linear region of the MR curve away from the zero magnetic field.

Additionally, when using a material such as PtMn, PdMn, RhMn, NiMn, or $\alpha\text{-Fe}_2O_3$, which has a high Neel temperature as the antiferromagnetic thin film, thermal treatment must be performed at a high temperature, this resulting in a lowering of the resistance change ratio in the magnetoresistive effect element, which is the output when used as an element.

On the other hand, when using a material such as Ni—O, Co—O, FeMn, or IrMn, which has a relatively low Neel temperature as an antiferromagnetic thin film, the thermal stability of the device with respect to operating temperature is poor, this leading to the problem of difficulty in achieving stable element operation.

Because the structure basically obtains a change in resistance by using the change in the mean free path of conducting electrons in a three-layer structure of a magnetic thin film,/a non-magnetic thin film,/and another magnetic thin film, compared with a magnetoresistive effect film known as a coupling type, which has a multiple layer structure, there is the additional problem that the resistance change ratio is small.

In view of the above-described shortcoming of the prior art, an object of the present invention is to provide a magnetoresistive effect element film which exhibits a large linear resistance change in the region of zero magnetic field and with a small external magnetic field, and which has superior immunity to heat. Yet another object of the present invention is the improvement of manufacturability by the control of the thermal treating of the exchange coupling film.

SUMMARY OF THE INVENTION

The inventors of the present invention performed repeated and various investigations aimed at achieving the above-noted, resulting in the completion of the present invention.

The present invention is a magnetoresistive effect element which has a plurality of magnetic thin films that are laminated onto a substrate with an intervening non-magnetic thin film, an antiferromagnetic thin film being provided on a one ferromagnetic thin film that is neighboring via the above-noted non-magnetic thin film, and if a bias magnetic field of this antiferromagnetic thin film is Hr and the coercivity of the other ferromagnetic thin film is a value of $Hc_2$, the condition of $Hc_2<Hr$ is satisfied, and further the above-noted antiferromagnetic thin film is either selected from a group consisting of CrMn, FeMn, IrMn, CoMn, CuMn, PtMn, PdMn, RhMn, NiMn, or an alloy composed of two or more of the members of the above-mentioned, and is a two-layer film made of the selected material.

Additionally, the present invention is a magnetoresistive effect element which has a plurality of magnetic thin films that are laminated onto a substrate with an intervening non-magnetic thin film, an antiferromagnetic thin film being provided on one ferromagnetic thin film that is neighboring via the above-noted non-magnetic thin film, and if a bias magnetic field of this antiferromagnetic thin film is value of Hr and the coercivity of the other ferromagnetic thin film is a value of $Hc_2$, the condition of $Hc_2<Hr$ is satisfied, and further the above-noted antiferromagnetic thin film is made of a cobalt oxide, a nickel oxide, an α-phase iron oxide, or an alloy made from two or more of these materials, and is a two-layer film made from the selected material.

Additionally, the present invention is related to a method of manufacturing the above-described magnetoresistive effect element, to a magnetoresistive effect element that uses the above-noted magnetoresistive effect film, and to a magnetic sensor and magnetoresistive detection system that use this element.

DETAILED DESCRIPTION OF THE PREFERRED EMBODIMENTS

Figure 1:
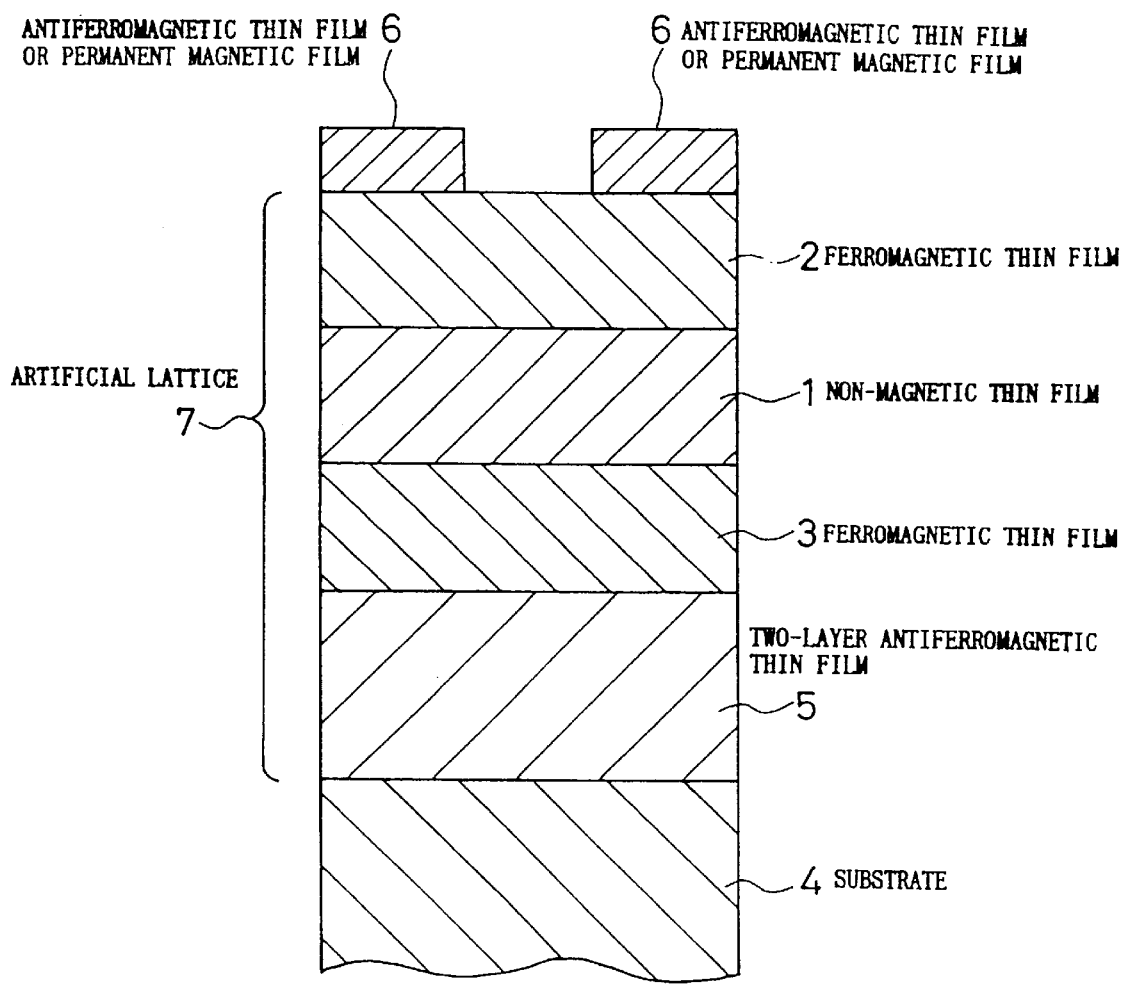
FIG. 1 is a simplified cross-sectional of an embodiment of a magnetoresistive effect film according to the present invention.

Embodiments of the present invention are described below, with reference being made to the relevant accompanying drawings.

A magnetoresistive effect film according to the present invention is formed by the lamination, onto a substrate of a plurality of magnetic thin films with an intervening non-magnetic thin film, a neighboring antiferromagnetic thin film being provided on one ferromagnetic thin film (magnetically fixed layer) that is neighboring via a non-magnetic thin film, a bias magnetic field of Hr being applied to this antiferromagnetic thin film and the coercivity of the other ferromagnetic thin film (free layer) being $Hc_2$, such that $Hc_2<Hr$.

The above-noted antiferromagnetic thin film that is used in a magnetoresistive effect film according to the present invention is made from a material that is selected from the group consisting of CrMn, FeMn, IrMn, CoMn, CuMn, PtMn, PdMn, RhMn, NiMn, or an alloy composed of two or more of the aforementioned members, and is a two-layer film made of the selected material.

It can also be made from a cobalt oxide, a nickel oxide, an a-phase iron oxide, or an alloy made from two or more of these materials, as a two-layer film made from the selected material.

When using a Mn based antiferromagnetic material such as noted above as the antiferromagnetic thin film, by using Ta, Zr, Hf or Ti as the underlayer of the magnetoresistive effect film, the crystallizing in the (111) direction of the magnetoresistive effect film is improved, enabling achieving of better magnetoresistive change. The thickness of this underlayer is desirably in the range 20 to 100 Å.

If the film thickness is greater than 20 Å, the underlayer effect is lost, and if the thickness exceeds 100, there is an increase in the current that flows divided in the underlayer, so that the resistance change ratio drops.

In the above-noted two-layer antiferromagnetic thin film, if the Neel temperature of one antiferromagnetic thin film is $TN_1$ and the Neel temperature of the other antiferromagnetic thin film is $TN_2$, by varying the film thickness ratio therebetween, an antiferromagnetic body having a Neel temperature of TN (where $TN_1<TN<TN_2$) is obtained.

By doing the above, in comparison with an antiferromagnetic material such as Ni—O, Co—O, FeMn, or IrMn or the like such as used in the past, which has a relatively low Neel temperature, there is an improvement in thermal stability at an operating temperature range of 80 to 100° C. of the magnetoresistive effect element.

Additionally, in comparison with an antiferromagnetic material such as PtMn, PdMn, RhMn, NiMn, or $\alpha$-$Fe_2O_3$ or like such as used in the past, which has a relatively high Neel temperature, the thermal treating temperature is reduced or thermal treating becomes unnecessary, thus suppressing the drop in the resistance change ratio when used as a magnetoresistive effect film.

In addition, there is an improvement in manufacturability of such a magnetoresistive effect element.

In the case of using an antiferromagnetic thin film made from the above-noted oxide materials, by forming the film with the substrate at a temperature in the range from room temperature to 300° C., there is an improvement in crystallization, and an increase in the bias magnetic field.

The film formation is performed by processes such as sputtering, molecular beam epitaxy (MBE), or the like. It is possible to use glass, Si, MgO, $Al_2O_3$, GaAs, ferrite, $CaTi_2O_3$, $BaTi_2O_3$, or $Al_2O_3$—TiC or the like as the material for the substrate.

In the present invention, by making the surface roughness of the antiferromagnetic thin film 2 to 15 Å, there is a change in the magnetic domain structure in the magnetic thin film laminated thereover, this causing a reduction in the coercivity of the exchange coupling film.

In the present invention, it is desirable that a thin film (oxidation prevention layer) which is made of nickel, iron or an alloy thereof be inserted between the antiferromagnetic thin film and the magnetic thin film, it being desirable that the thickness thereof be 3 to 30 Å, further desirable that it be 7 to 30 Å, and yet further desirable that it be 10 to 30 Å.

By doing this, oxidation of the magnetic thin film is suppressed, and there is also a significant reduction in the exchange coupling magnetic field and an improvement in the reduction of the resistance change when heat treating.

At less than 3 Å, insufficient effect is obtained, and at above 30 Å there is a problem with obtaining a practically usable output and with symmetry of the output signal waveform.

It is desirable that the ferromagnetic thin film of a magnetoresistive effect film of the present invention be made of Ni, Fe, Co, FeCo, NiFe, NiFeCo or an alloy of two or more of these materials. By using this material, there is a great effect of dispersion of the conduction electrons at the boundary between the non-magnetic thin film and the ferromagnetic thin film, so that a larger change in resistance is obtained.

The ferromagnetic thin film of the present invention is formed from a material selected from the magnetic materials noted above, and it is particularly desirable that the material be selected so that the anisotropic magnetic field $Hk_2$ of the magnetic film that is not adjacent to the antiferromagnetic thin film be greater than the coercivity $Hc_2$.

It is also possible to make the anisotropic magnetic field large by the film thickness small.

For example, if a NiFe film is made to a thickness of approximately 10 Å, it is possible to make the anisotropic magnetic field $Hk_2$ larger than the coercivity $Hc_2$.

Additionally, it is possible to manufacture the above-noted magnetoresistive effect element so that the easy magnetization axis of the magnetic film is perpendicular with respect to the direction of the applied signal magnetic field, and so that the coercivity of the magnetic thin film in the direction of the signal magnetic field is such that $Hc_2<Hk_2<Hr$, by forming the magnetic thin film within a magnetic field.

Specifically, the applied magnetic field is rotated by 90 degrees during the formation of the film, so that the easy axis of the magnetic thin film which is adjacent the antiferromagnetic thin film is perpendicular to the easy magnetization direction of magnetic thin film that is neighboring thereto via an intervening non-magnetic film, or alternately to rotate the substrate by 90 degrees in the magnetic field.

It is desirable that the thickness of each magnetic thin film be 150 Å or less. If the film thickness is made larger than 150 Å, accompanying the increase in film thickness there is an increase in the region that does not contribute to electron dispersion, resulting in a reduction in the giant magnetoresistive effect.

While there is no particular lower limit to the thickness of the magnetic thin films, at a thickness below 10 Å, there is a large surface dispersion of conduction electrons, resulting in a reduction in the magnetoresistive change.

If the thickness is made 10 Å or greater, it is easy to maintain a uniform film thickness, and good characteristics are achieved. Additionally, there is no problem of the saturation magnetization becoming small.

The coercivity of a magnetic thin film which is adjacent to an antiferromagnetic thin film can be made small by making the substrate temperature from room temperature to 300° C. and continuously forming it with the antiferromagnetic thin film.

In addition, by inserting Co, FeCo, NiCo, or NiFeCo at the boundary between the magnetic thin film and the non-magnetic thin film, the probability of conduction electron boundary dispersion is increased, thereby enabling achievement of a large resistance change.

The lower limit of the inserted thin film is 3 Å. At below this, there is not only a reduced effect of insertion, but also it becomes difficult to control the growth of the film.

While there is no particular upper limit on the thickness of the inserted film, it is desirable that this be approximately 40 Å.

At greater than this, hysteresis occurs in the output in the operation range of the magnetoresistive effect element.

The non-magnetic thin film is a material which serves the purpose of weakening the magnetic interaction between magnetic thin films and, to achieve high resistance change and immunity to heat, it is desirable that this be made of one or more metals from the group consisting of Cu, Au, Ag, and Ru.

It is desirable that the thickness of the non-magnetic thin film be in the range from 20 to 35 Å.

In general, if the film thickness exceeds 35 Å, the resistance is established by the non-magnetic thin film, the dispersion effect which is dependent upon spin becoming relatively small, this resulting in a small magnetic resistance change ratio.

If the film thickness is greater than 20 Å, the magnetic interaction between magnetic thin films becomes excessively great, and it becomes impossible to avoid the occurrence of the direct magnetic contact condition (pinholes and the like), resulting in a condition in which the magnetization directions of the magnetic thin films are mutually different.

The thickness of the magnetic thin film or the non-magnetic thin film can be measured, for example, by a transmission-type electron microscope, a scanning-type electron microscope, or by Auger electron spectroscopy. The crystallization structure of the thin film can be verified by such means as X-ray diffraction or high-speed electron beam diffraction.

When configuring a magnetoresistive effect element, there is no particular restriction to the number of lamination repetitions N of an artificial lattice film, it being possible to establish this in accordance with the desired magnetic resistance change ratio.

However, because the antiferromagnetic thin film resistivity is large, resulting in loss of lamination effect, it is preferable that this structure be formed by a antiferromagnetic layer/ferromagnetic layer/non-magnetic layer/ferromagnetic layer/non-magnetic layer/magnetic layer/antiferromagnetic layer structure.

The surface of the uppermost magnetic thin film such as the ferromagnetic film does not need to be provided with an oxidation preventing film of silicon nitride, silicon oxide, alumina or the like, and it is possible to provide a metallic conductive layer for the purpose of making wiring connections to electrodes.

Because it is not possible to directly measure the magnetic characteristics of the magnetic thin films that exist within the magnetoresistive effect element, the measurement is usually made as follows.

The magnetic thin film to be measured is formed in a measurement sample, with alternate films of this film and a non-magnetic thin film grown so as to reach a total thickness of 500 to 1000 Å, the magnetic characteristics of this laminate being then measured.

In this case, the thickness of the magnetic thin film, the thickness of the non-magnetic thin film, and the composition of the non-magnetic thin film are the same as used in the magnetoresistive effect element under measurement.

In the magnetoresistive effect element of the present invention, by performing microprocessing with respect to a magnetoresistive effect film the element height is made 0.5 to 1.5 $\mu$m, the current density that is detected when the magnetic field is sensed being 0.5 to $5 \times 10^7$ A/cm$^2$.

The result is the achievement of a large output signal and a waveform of good symmetry.

In a magnetoresistive effect element film such as this, it is possible to suppress the Barkhausen noise by bringing the another ferromagnetic thin film not neighbouring to the antiferromagnetic thin film into single magnetic domain due to generating a bias magnetic field.

Note that, in a magnetoresistive effect element film, by bringing a permanent magnet thin film into proximity of the magnetic layer which detects the external magnetic field, that is the ferromagnetic thin film not adjacent to the antiferromagnetic thin film, in the easy magnetization direction of the ferromagnetic thin film, it is possible to achieve stabilization of magnetic domains, and to avoid non-linear output such as caused by a Barkhausen jump.

It is preferable to use a material such as CoCr, CoCrTa, CoCrTaPt, CoCrPt, CoNiPt, CoNiCr, CoCrPtSi, or FeCoCr as the material for the permanent magnet thin film. It is also possible to use Cr or the like as a base layer for these permanent magnet thin films.

By sandwiching a magnetoresistive effect element such as described above between a high-permeability soft magnetic material via an insulating layer to form a shield-type magnetoresistive sensor, or by guiding the signal magnetic field by a high-permeability soft magnetic material in a yoke-type magnetoresistive sensor, it is possible to use this as a magnetic reading transducer having a further improved density.

Additionally, in the present invention, by forming a magnetoresistive detection system that has both a magnetoresistive effect element and a means for detecting the resistance change ratio of this magnetoresistive effect element as a function of the detected magnetic field, it is possible to obtain a large output signal which is not dependent upon the tangential speed of a magnetic disk.

In a magnetoresistive effect film according to the present invention, it is essential that an antiferromagnetic thin film be formed on one ferromagnetic thin film and that an exchange bias force be operative.

Figure 3:
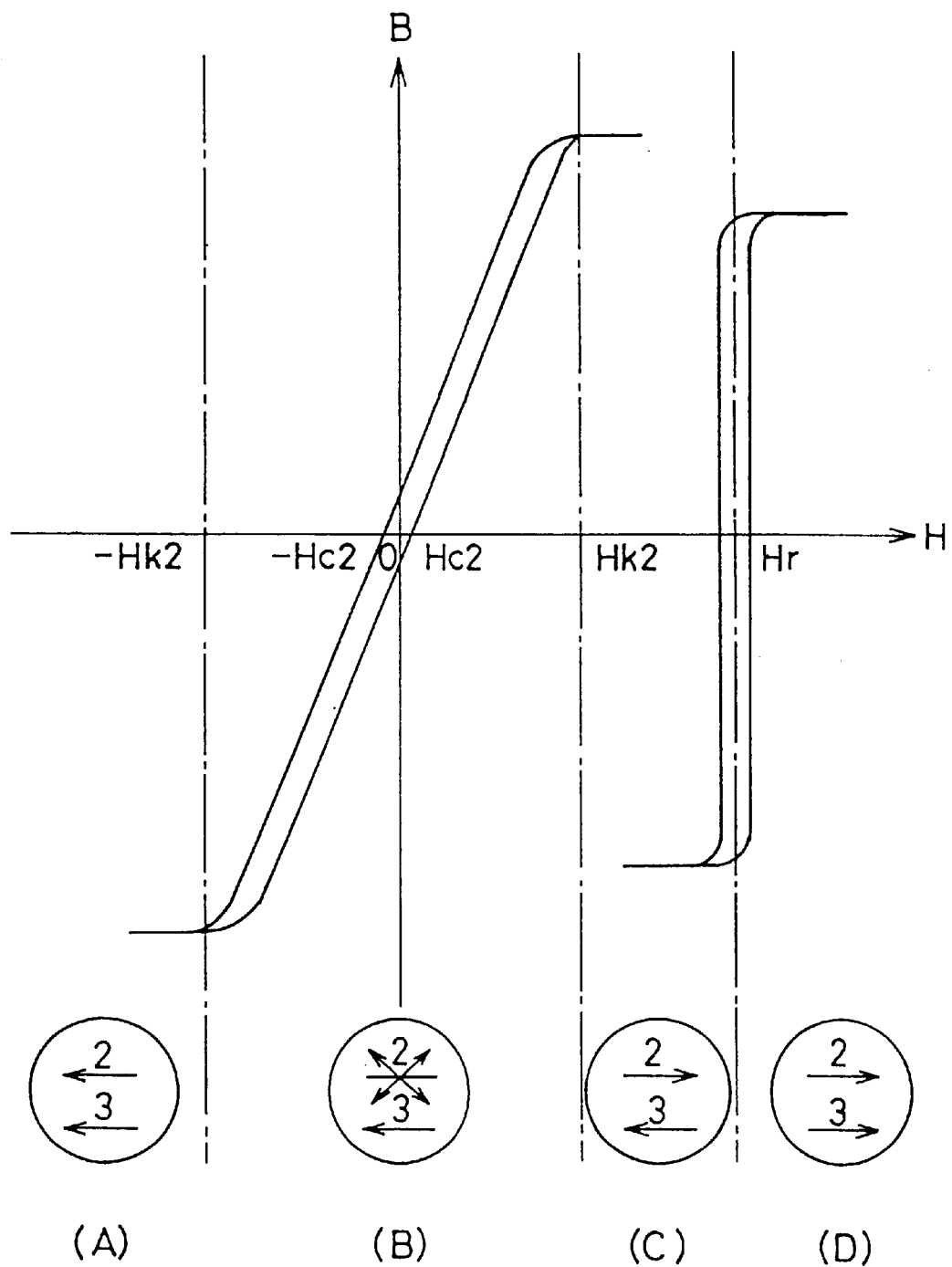
FIG. 3 is a B-H curve that illustrates the operating principle of a magnetoresistive effect film according to the present invention.

The reason for this is that, as shown in region (C) of FIG. 3, when the external magnetic field is between the anisotropic magnetic field $Hk_2$ of the ferromagnetic thin film and the coercivity Hr of the other ferromagnetic thin film, that is, when $Hk_2<H<Hr$, the magnetization directions of neighboring ferromagnetic thin films are mutually opposite.

Figure 2:
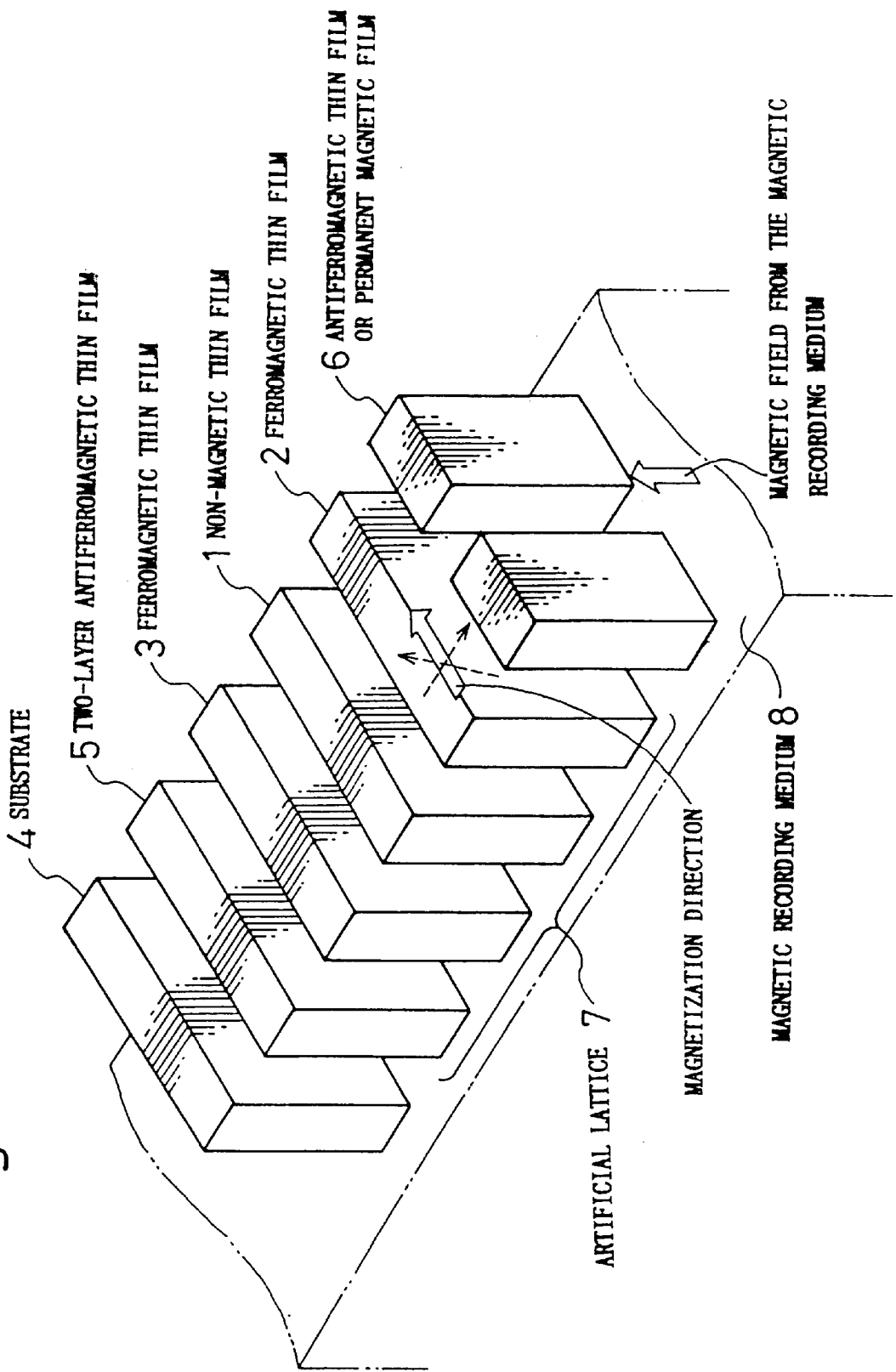
FIG. 2 is a exploded perspective view of an embodiment of a magnetoresistive sensor according to the present invention.

FIG. 2 is an exploded perspective view which shows an example of an MR sensor which uses the magnetoresistive effect film according to the present invention.

This MR sensor, as shown in FIG. 2, is formed by an artificial lattice film 7 which is formed on a substrate 4, ferromagnetic thin films 2 and 3 being formed on a two-layer antiferromagnetic thin film 5 onto top of substrate 4, with an intervening non-magnetic thin film 1, the easy magnetizing axes of these ferromagnetic thin films 2 and 3 made to cross one another perpendicularly, so that the signal magnetic field released from the magnetic recording medium 8 is perpendicular with respect to the easy magnetizing axis direction of the ferromagnetic thin film 2.

Under these conditions, the ferromagnetic thin film 3 has single-direction anisotropy imparted to it by the neighboring two-layer antiferromagnetic thin film 5.

By rotating the magnetization direction of the ferromagnetic thin film 2 in response to the size of the signal magnetic field of the magnetic recording medium 8, the resistance changes so that the magnetic field is detected.

The relationship between the external magnetic field, the coercivity, and the magnetization direction is as follows.

In FIG. 3, the coercivity of the exchange-biased ferromagnetic thin film is Hr, the coercivity of the other ferromagnetic thin film is $Hc_2$ and the anisotropic magnetic field is $Hk_2$ (where $O<Hk_2<Hr$).

At first, the external magnetic field H is applied so that $H<-Hk_2$ (region (A)).

Under this condition, the magnetization directions of the magnetic thin films 2 and 3 are the same as H (negative). Next, as the external magnetic field is weakened, under the condition $-Hk_2<H<Hk_2$ (region (B)), the magnetization of the magnetic thin film 2 reverses to the positive direction, and when $Hk_2<H<Hr$ (in region (C)), the magnetization directions of the magnetic thin films 2 and 3 are mutually opposite.

When the external magnetic field is further increased so that $Hr<H$ (region (D)), the magnetization direction of the magnetic thin film 3 also reverses, so that the magnetization directions of both magnetic thin film 2 and magnetic thin film 3 are positive.

Figure 4:
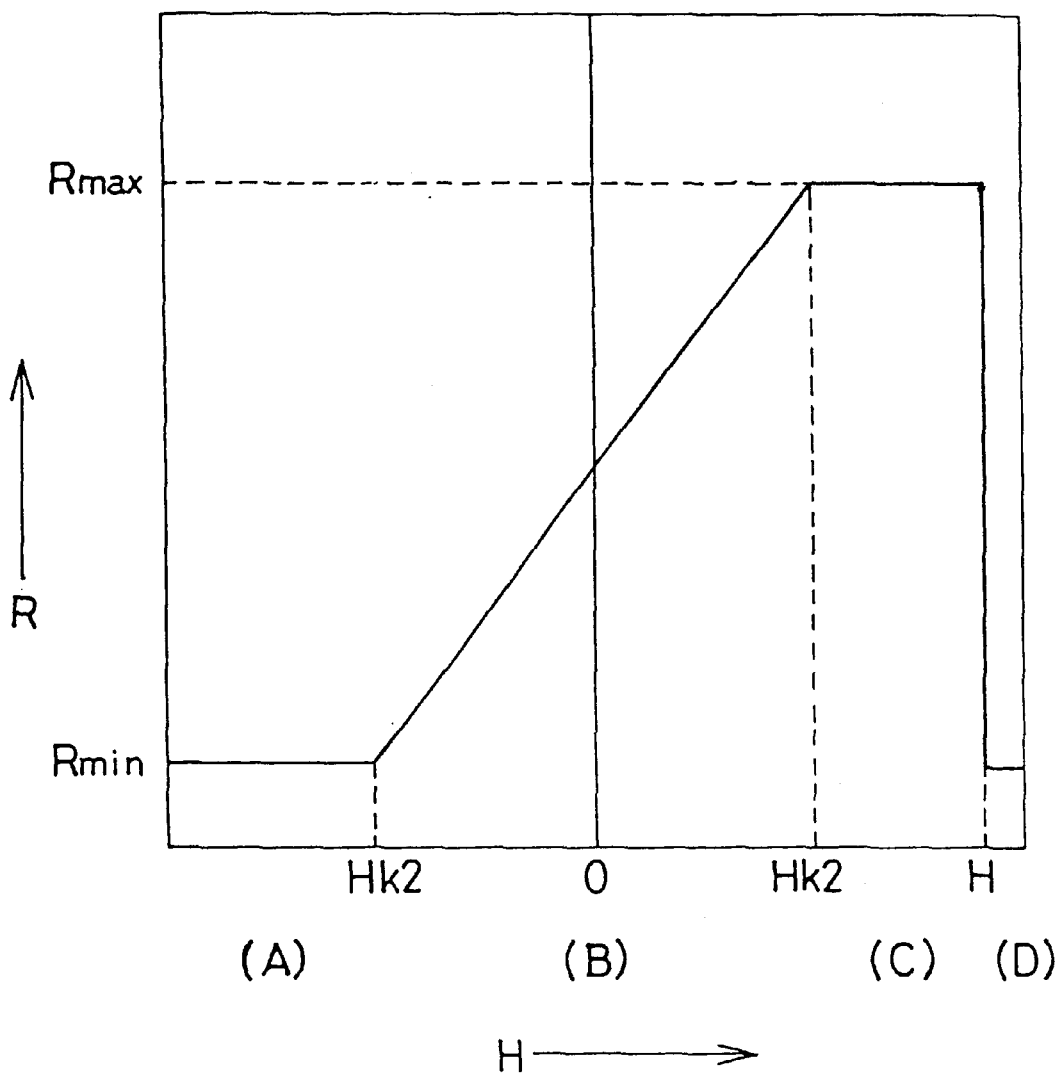
FIG. 4 is an RH curve that illustrates the operating principle of a magnetoresistive effect film according to the present invention.

As shown in FIG. 4, the resistance of this film varies in response to the relative magnetization directions of magnetic thin films 2 and 3, this varying linearly in the region of zero magnetic field, the maximum value Rmax being exhibited in region (C).

What follows is a description of the embodiment of the present invention in further detail, although the present invention is not limited to this embodiment.

FIG. 1 is a simplified cross-sectional view of a magnetoresistive effect film which is an embodiment of the present invention.

In FIG. 1, the artificial lattice 7 has the ferromagnetic thin films 2 and 3 which are formed on top of the two-layer ferromagnetic thin film 5, which is formed on the substrate 4, a non-magnetic thin film 1 being disposed between these two ferromagnetic thin films 2 and 3. On the ferromagnetic thin film 2 is laminated an antiferromagnetic thin film or a permanent magnetic thin film 6 so as to be neighboring thereto.

A glass plate, to serve as the substrate 4, is placed in a vacuum apparatus, a vacuum is drawn to the order of $10^{-7}$ Torr.

The substrate temperature is maintained at from room temperature to 300° C., and on the substrate are grown an NiO film of thickness 100 to 1000 Å, an FeO thin film of thickness from 10 to 100 Å, and then a magnetic thin film (of NiFe, Co, FeCo, NiCo, or NiFeCo).

After forming an exchange coupling film as noted above at a temperature from room temperature to 300° C., the substrate temperature is returned to room temperature, and the non-magnetic and magnetic layers are formed. When doing this, the applied magnetic field during film growth is rotated by 90 degrees, so that the easy magnetization direction of the exchange coupling film and the magnetic layer which is adjacent thereto via an intervening non-magnetic layer are mutually perpendicular.

In the case of a Mn-based antiferromagnetic thin film material, the lamination sequence of the above-noted ferromagnetic thin film during film formation is the opposite.

That is, the substrate is maintained at room temperature, a sublayer (Ta, Zr, Hf, Ti) is formed, and then the ferromagnetic thin film is formed. Then, the applied magnetic field is rotated by 90 degrees during the film formation. Next, the non-magnetic thin film and the ferromagnetic thin film are formed, and finally the antiferromagnetic thin film is laminated to form the magnetoresistive effect film.

Then this artificial lattice film is placed in a heating oven, and heat treated at a temperature of 200 to 300° C. while applying a DC magnetic field of 300 to 3000 Oe in the easy magnetization direction of the exchange coupling film, thereby forming the magnetoresistive effect film.

In this manner, by heat treating the antiferromagnetic thin film and the ferromagnetic thin film which is neighboring thereto within a magnetic field at a temperature of 200 to 300° C., the antiferromagnetic phase is induced or spin orientation occurs, resulting in an even greater single-direction anisotropy.

Specifically, the film formation is done by positioning an NdFeB magnetic at both sides of the glass plate and by applying an external magnetic field of 300 Oe in parallel with the glass plate.

If the B-H curve of this sample is measured, during the film formation the direction of the applied magnetic field is the easy magnetizing direction of the magnetic layer.

With regard to the artificial lattice films indicated below, the films were formed at a rate of 2.2 to 3.5 Å/s for the oxide antiferromagnetic thin film, and a rate of approximately 0.8 to 2.0 Å/second for the Mn-based antiferromagnetic thin film, ferromagnetic thin film, and non-magnetic thin film.

In the following, the notation glass/NiO(500)/Fe—O(20)/NiFe(60)/Cu(25)/NiFe(60) would mean the sequential lamination onto a glass substrate of an NiO thin film of a thickness of 500 Å and an Fe—O thin film having a thickness of 20 Å, so as to form the two-layer antiferromagnetic thin film, after which a Ni80%-Fe20% alloy thin film having a thickness of 60 Å, a Cu thin film having a thickness of 25 Å, and a Ni80%-Fe20% thin film having a thickness of 60 Å are sequentially grown.

The measurement of magnetization was performed using an oscillating magnetization meter. The resistance measurement was performed by fabricating a sample measuring 1.0 by 10 mm², and using a four-wire resistance measurement to perform the measurement while varying the external magnetic field from −700 to 700 Oe so that the field within the surface is perpendicular to the current flowing therein, the magnetic resistance change ratio Δ R/R being determined. The maximum and minimum values of the resistance change ratio Δ R/R represented as Rmax and Rmin, respectively, this change ratio was calculated by the equation Δ R/R= (Rmax−Rmin)/Rmin×100%.

1. For the case of a non-magnetic layer being made of Cu and a free layer and magnetic fixed layer which are both made of NiFe:
    (a) glass/Ta(50 Å)/NiFe(20~150)/Cu(8~40)/NiFe(20~150)/FeMn(10~50)/NiMn(150~500)
    (b) glass/Ta(50 Å)/NiFe(20~150)/Cu(8~40)/NiFe(20~150)/FeMn(10~50)/PtMn(150~500)
    (c) glass/Ta(50 Å)/NiFe(20~150)/Cu(8~40)/NiFe(20~150)/FeMn(10~50)/PdMn(150~500)
    (d) glass/Ta(50 Å)/NiFe(20~150)/Cu(8~40)/NiFe(20~150)/CuMn(10~50)/NiMn(150~500)
    (e) glass/Ta(50 Å)/NiFe(20~150)/Cu(8~40)/NiFe(20~150)/CoMn(10~50)/NiMn(150~500)
    (f) glass/Ta(50 Å)/NiFe(20~150)/Cu(8~40)/NiFe(20~150)/NiMn(10~50)/CrMn(150~500)
    (g) glass/Ta(50 Å)/NiFe(20~150)/Cu(8~40)/NiFe(20~150)/NiMn(10~50)/FeMn(50~150)
    (h) glass/Ta(50 Å)/NiFe(20~150)/Cu(8~40)/NiFe(20~150)/PtMn(10~50)/FeMn(50~150)
    (i) glass/Ta(50 Å)/NiFe(20~150)/Cu(8~40)/NiFe(20~150)/PdMn(10~50)/FeMn(50~150)
    (j) glass/Ta(50 Å)/NiFe(20~150)/Cu(8~40)/NiFe(20~150)/NiMn(10~50)/IrMn(100~200)
    (k) glass/Ta(50 Å)/NiFe(20~150)/Cu(8~40)/NiFe(20~150)/PtMn(10~50)/IrMn(100~200)
    (l) glass/Ta(50 Å)/NiFe(20~150)/Cu(8~40)/NiFe(20~150)/PdMn(10~50)/IrMn(100~200)
    (m) glass/Ni—O(150~500)/Fe—O(10~100)/
    (n) glass/NiCoO(150~500)/Fe—O(10~100)/NiFe(20~150)/Cu(8~40)/NiFe(20~150)
    (o) glass/Fe—O(150~500)/Ni—O(10~100)/NiFe(20~150)/Cu(8~40)/NiFe(20~150)
    (p) glass/Fe—O(150~500)/NiCoO(10~100)/NiFe(20~150)/Cu(8~40)/NiFe(20~150)
    (q) glass/Fe—O(150~500)/Co-O(10~100)/NiFe(20~150)/Cu(8~40)/NiFe(20~150)
2. For the case of an non-magnetic layer being made of Cu and a free layer made of NiFe, and a magnetic fixed layer made of $Co_{90}Fe_{10}$:
    (a) glass/Ta(50 Å)/NiFe(20~150)/Cu(8~40)/$Co_{90}Fe_{10}$(20~150)/FeMn(10~150)/NiMn(150~500)

(b) glass/Ta(50 Å)/NiFe(20~150)/Cu(8~40)/Co$_{90}$Fe$_{10}$(20~150)/FeMn(10~50)/PtMn(150~500)

(c) glass/Ta(50 Å)/NiFe(20~150)/Cu(8~40)/Co$_{90}$Fe$_{10}$(20~150)/FeMn(10~50)/PdMn(150~500)

(d) glass/Ta(50 Å)/NiFe(20~150)/Cu(8~40)/Co$_{90}$Fe$_{10}$(20~150)/CuMn(10~50)/NiMn(150~500)

(e) glass/Ta(50 Å)/NiFe(20~150)/Cu(8~40)/Co$_{90}$Fe$_{10}$(20~150)/CoMn(10~50)/NiMn(150~500)

(f) glass/Ta(50 Å)/NiFe(20~150)/Cu(8~40)/Co$_{90}$Fe$_{10}$(20~150)/NiMn(10~50)/CrMn(150~500)

(g) glass/Ta(50 Å)/NiFe(20~150)/Cu(8~40)/Co$_{90}$Fe$_{10}$(20~150)/NiMn(10~50)/FeMn(50~150)

(h) glass/Ta(50 Å)/NiFe(20~150)/Cu(8~40)/Co$_{90}$Fe$_{10}$(20~150)/PtMn(10~50)/FeMn(50~150)

(i) glass/Ta(50 Å)/NiFe(20~150)/Cu(8~40)/Co$_{90}$Fe$_{10}$(20~150)/PdMn(10~50)/FeMn(50~150)

(j) glass/Ta(50 Å)/NiFe(20~150)/Cu(8~40)/Co$_{90}$Fe$_{10}$(20~150)/NiMn(10~50)/IrMn(100~200)

(k) glass/Ta(50 Å)/NiFe(20~150)/Cu(8~40)/Co$_{90}$Fe$_{10}$(20~150)/PtMn(10~50)/IrMn(100~200)

(l) glass/Ta(50 Å)/NiFe(20~150)/Cu(8~40)/Co$_{90}$Fe$_{10}$(20~150)/PdMn(10~50)/IrMn(100~200)

(m) glass/Ni—O(150~500)/Fe—O(10~100)/Co$_{90}$Fe$_{10}$(20~150)/Cu(8~40)/NiFe(20~150)

(n) glass/Fe—O(150~500)/Ni—O(10~100)/Co$_{90}$Fe$_{10}$(20~150)/Cu(8~40)/NiFe(20~150)

(o) glass/Fe—O(150~500)/Co—O(10~100)/Co$_{90}$Fe$_{10}$(20~150)/Cu(8~40)/NiFe(20~150)

(p) glass/Ni—O(150~500)/Fe—O(10~100)/Co$_{90}$Fe$_{10}$(20~150)/Cu(8~40)/NiFe(20~150)

3. For the case of an non-magnetic layer being made of Au and a free layer and magnetic fixed layer both made of NiFe:

(a) glass/Ta(50 Å)/NiFe(20~150)/Au(8~40)/NiFe(20~150)/FeMn(10~50)/NiMn(150~500)

(b) glass/Ta(50 Å)/NiFe(20~150)/Au(8~40)/NiFe(20~150)/FeMn(10~50)/PtMn(150~500)

(c) glass/Ta(50 Å)/NiFe(20~150)/Au(8~40)/NiFe(20~150)/FeMn(10~50)/PdMn(150~500)

(d) glass/Ta(50 Å)/NiFe(20~150)/Au(8~40)/NiFe(20~150)/CuMn(10~50)/NiMn(150~500)

(e) glass/Ta(50 Å)/NiFe(20~150)/Au(8~40)/NiFe(20~150)/CoMn(10~50)/NiMn(150~500)

(f) glass/Ta(50 Å)/NiFe(20~150)/Au(8~40)/NiFe(20~150)/NiMn(10~50)/CrMn(150~500)

(g) glass/Ni—O(150~500)/Fe—O(10~100)/NiFe(20~150)/Au(8~40)/NiFe(20~150)

(h) glass/Fe—O(150~500)/Ni—O(10~100)/NiFe(20~150)/Au(8~40)/NiFe(20~150)

(i) glass/Fe—O(150~500)/Co—O(10~100)/NiFe(20~150)/Au(8~40)/NiFe(20~150)

4. For the case of an non-magnetic layer being made of Ag and a free layer and magnetic fixed layer both made of NiFe:

(a) glass/Ta(50 Å)/NiFe(20~150)/Ag(8~40)/NiFe(20~150)/FeMn(10~50)/NiMn(150~500)

(b) glass/Ta(50 Å)/NiFe(20~150)/Ag(8~40)/NiFe(20~150)/FeMn(10~50)/PtMn(150~500)

(c) glass/Ta(50 Å)/NiFe(20~150)/Ag(8~40)/NiFe(20~150)/FeMn(10~50)/PdMn(150~500)

(d) glass/Ta(50 Å)/NiFe(20~150)/Ag(8~40)/NiFe(20~150)/CuMn(10~50)/NiMn(150~500)

(e) glass/Ta(50 Å)/NiFe(20~150)/Ag(8~40)/NiFe(20~150)/CoMn(10~50)/NiMn(150~500)

(f) glass/Ta(50 Å)/NiFe(20~150)/Ag(8~40)/NiFe(20~150)/NiMn(10~50)/CrMn(150~500)

(g) glass/Ni—O(150~500)/Fe—O(10~100)/NiFe(20~150)/Ag(8~40)/NiFe(20~150)

(h) glass/Fe—O(150~500)/Ni—O(10~100)/NiFe(20~150)/Ag(8~40)/NiFe(20~150)

(i) glass/Fe—O(150~500)/Co—O(10~100)/NiFe(20~150)/Ag(8~40)/NiFe(20~150)

5. For the case of an non-magnetic layer being made of Ru and a free layer and magnetic fixed layer both made of NiFe:

(a) glass/Ta(50 Å)/NiFe(20~150)/Ru(8~40)/NiFe(20~150)/FeMn(10~50)/NiMn(150~500)

(b) glass/Ta(50 Å)/NiFe(20~150)/Ru(8~40)/NiFe(20~150)/FeMn(10~50)/PtMn(150~500)

(c) glass/Ta(50 Å)/NiFe(20~150)/Ru(8~40)/NiFe(20~150)/FeMn(10~50)/PdMn(150~500)

(d) glass/Ta(50 Å)/NiFe(20~150)/Ru(8~40)/NiFe(20~150)/CuMn(10~50)/NiMn(150~500)

(e) glass/Ta(50 Å)/NiFe(20~150)/Ru(8~40)/NiFe(20~150)/CoMn(10~50)/NiMn(150~500)

(f) glass/Ta(50 Å)/NiFe(20~150)/Ru(8~40)/NiFe(20~150)/NiMn(10~50)/CrMn(150~500)

(g) glass/Ni—O(150~500)/Fe—O(10~100)/NiFe(20~150)/Ru(8~40)/NiFe(20~150)

(h) glass/Fe—O(150~500)/Ni—O(10~100)/NiFe(20~150)/Ru(8~40)/NiFe(20~150)

(i) glass/Fe—O(150~500)/Co—O(10~100)/NiFe(20~150)/Ru(8~40)/NiFe(20~150)

6. For the case of an non-magnetic layer being made of Cu$_{1-x}$Ag$_x$ and a free layer and magnetic fixed layer both made of NiFe:

(a) glass/Ta(50 Å)/NiFe(20~150)/Cu$_{1-x}$Ag$_x$(8~40)/NiFe(20~150)/FeMn(10~50)/NiMn(150~500)

(b) glass/Ta(50 Å)/NiFe(20~150)/Cu$_{1-x}$Ag$_x$(8~40)/NiFe(20~150)/FeMn(10~50)/PtMn(150~500)

(c) glass/Ta(50 Å)/NiFe(20~150)/Cu$_{1-x}$Ag$_x$(8~40)/NiFe(20~150)/FeMn(10~50)/PdMn(150~500)

(d) glass/Ta(50 Å)/NiFe(20~150)/Cu$_{1-x}$Ag$_x$(8~40)/NiFe(20~150)/CuMn(10~50)/NiMn(150~500)

(e) glass/Ta(50 Å)/NiFe(20~150)/Cu$_{1-x}$Ag$_x$(8~40)/NiFe(20~150)/CoMn(10~50)/NiMn(150~500)

(f) glass/Ta(50 Å)/NiFe(20~150)/Cu$_{1-x}$Ag$_x$(8~40)/NiFe(20~150)/NiMn(10~50)/CrMn(150~500)

(g) glass/Ta(50 Å)/NiFe(20~150)/Cu$_{1-x}$Ag$_x$(8~40)/NiFe(20~150)/NiMn(10~50)/FeMn(50~150)

(h) glass/Ta(50 Å)/NiFe(20~150)/Cu$_{1-x}$Ag$_x$(8~40)/NiFe(20~150)/PtMn(10~50)/FeMn(50~150)

(i) glass/Ta(50 Å)/NiFe(20~150)/Cu$_{1-x}$Ag$_x$(8~40)/NiFe(20~150)/PdMn(10~50)/FeMn(50~150)

(j) glass/Ta(50 Å)/NiFe(20~150)/Cu$_{1-x}$Ag$_x$(8~40)/NiFe(20~150)/NiMn(10~50)/IrMn(100~200)

(k) glass/Ta(50 Å)/NiFe(20~150)/Cu$_{1-x}$Ag$_x$(8~40)/NiFe(20~150)/PtMn(10~50)/IrMn(100~200)

(l) glass/Ta(50 Å)/NiFe(20~150)/Cu$_{1-x}$Ag$_x$(8~40)/NiFe(20~150)/PdMn(10~50)/IrMn(100~200)

(m) glass/Ni—O(150~500)/Fe—O(10~100)/NiFe(20~150)/Cu$_{1-x}$Ag$_x$(8~40)/NiFe(20~150)

(n) glass/Fe—O(150~500)/Ni—O(10~100)/NiFe(20~150)/Cu$_{1-x}$Ag$_x$(8~40)/NiFe(20~150)

(o)glass/Fe—O(150~500)/Co—O(10~100)/NiFe(20~150)/Cu$_{1-x}$Ag$_x$(8~40)/NiFe(20~150)

7. For the case in which an oxide preventing layer is provided:

(a)glass/Ni—O(150~500)/Fe—O(20)/Fe(7~30)/NiFe(20~150)/Cu(8~40)/NiFe(20~150)

(b)glass/Ni—O(150~500)/Fe—O(20)/Ni(7~30)/NiFe(20~150)/Cu(8~40)/NiFe(20~150)

(c)glass/NiCoO(150~500)/Fe—O(20)/Fe(7~30)/NiFe(20~150)/Cu(8~40)/NiFe(20~150)

(d)glass/Fe—O(150~500)/Ni—O(10~100)/Fe(7~30)/NiFe(20~150)/Cu(8~40)/NiFe(20~150)

(e)glass/Fe—O(150~500)/NiCoO(10~100)/Fe(7~30)/NiFe(20~150)/Cu(8~40)/NiFe(20~150)

(f)glass/Fe—O(150~500)/Co—O(10~100)/Fe(7~30)/NiFe(20~150)/Cu(8~40)/NiFe(20~150)

Figure 7:
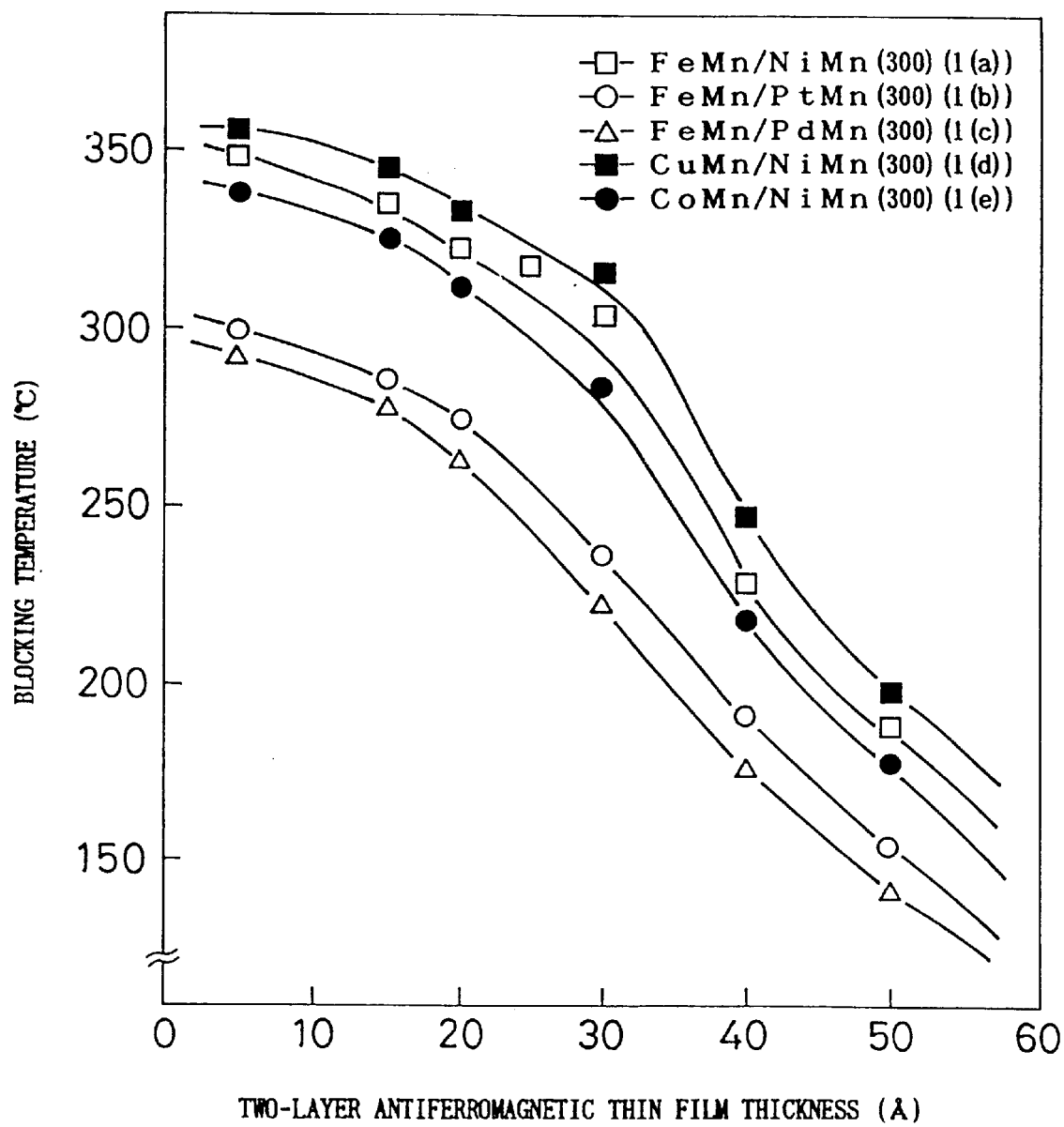
FIG. 7 is a graph which shows the relationship between the blocking temperature and the antiferromagnetic thin film thickness of a magnetoresistive effect film according to the present invention.
Figure 8:
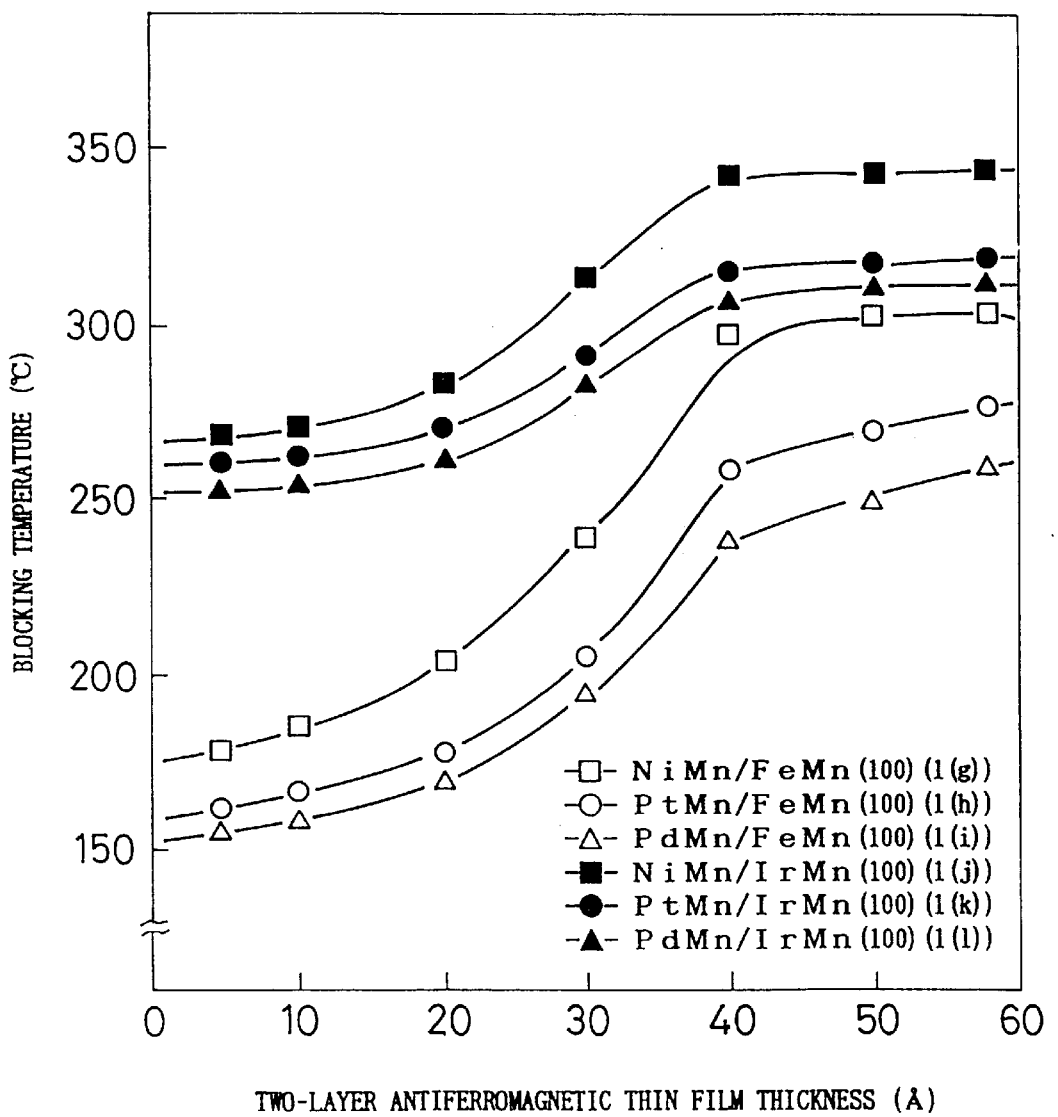
FIG. 8 is a graph which shows the relationship between the blocking temperature and the antiferromagnetic thin film thickness of a magnetoresistive effect film according to the present invention.
Figure 9:
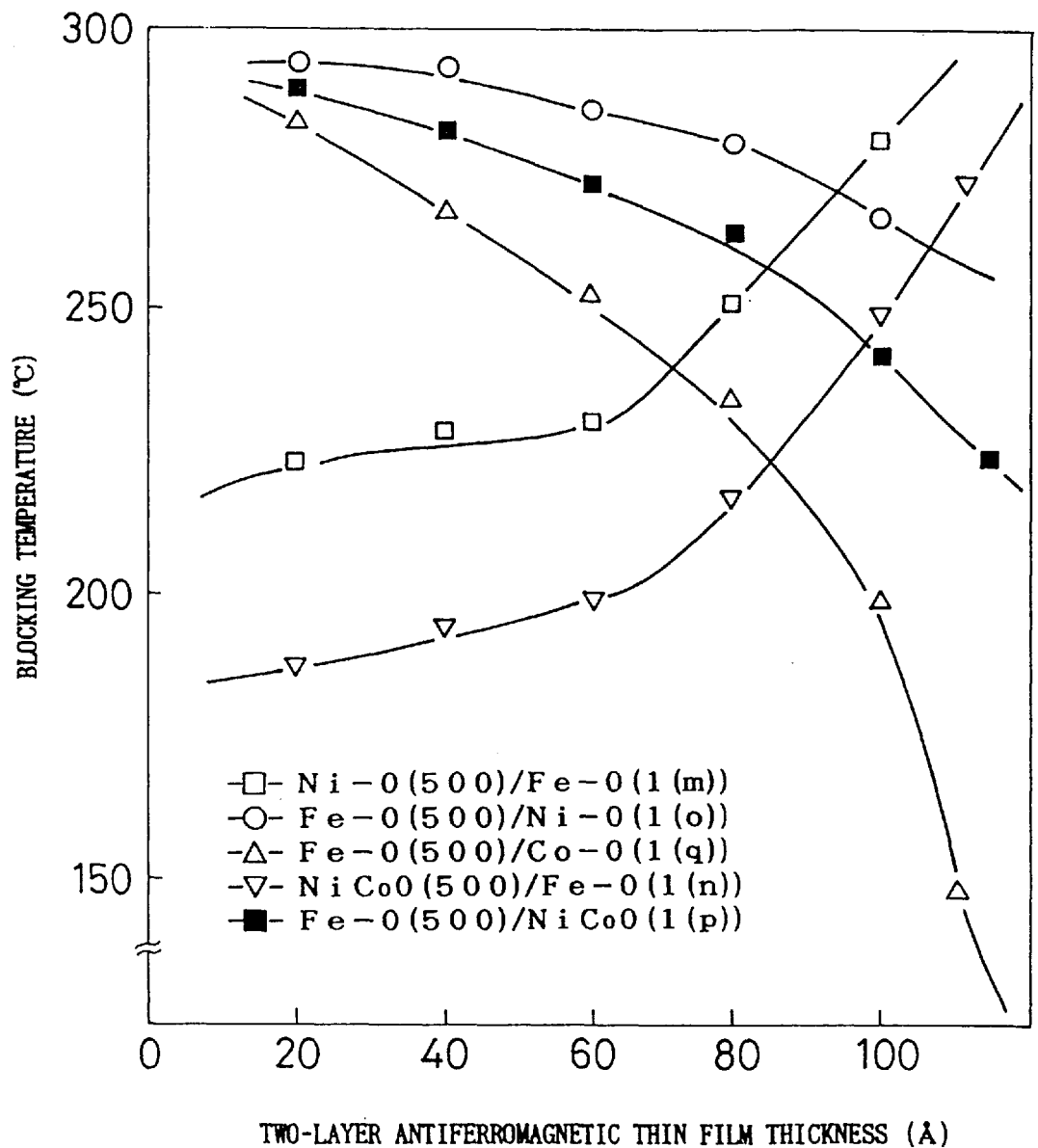
FIG. 9 is a graph which shows the relationship between the blocking temperature and the antiferromagnetic thin film thickness of a magnetoresistive effect film according to the present invention.

FIGS. 7, 8, and 9 are graphs that show the relationship between the blocking temperature (temperature at which the bias magnetic field is lost) and the antiferromagnetic thin film thickness.

By laminating a material having a high blocking temperature with a material having a low blocking temperature, the block temperature varies according to the laminate thickness, and it can be seen that it is possible to apply bias as 200 to 300° C.

This technical feature is the most important characteristic of the present invention.

Note that when the blocking temperature of the anti ferromagnetic film can be adjustable, the processing condition for producing this magnetoresistive effect thin film can be variable so as to make the manufacturing process thereof easily and flexible.

Figure 10:
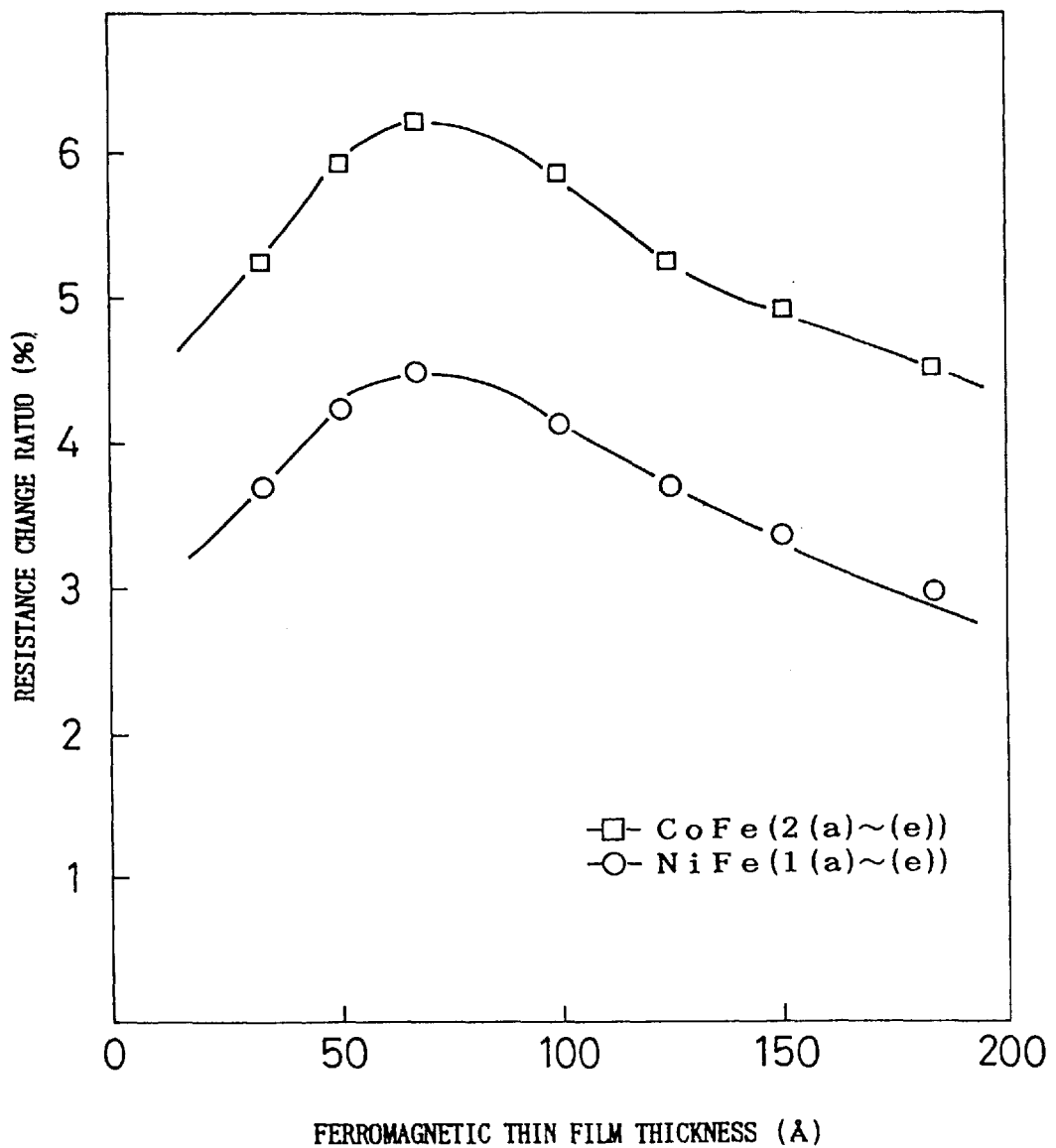
FIG. 10 is a graph which shows the relationship between the resistance change ratio and the ferromagnetic thin film thickness of a magnetoresistive effect film according to the present invention.

FIG. 10 is a graph which shows the relationship of the resistance change ratio to the ferromagnetic thin film thickness.

The resistance change ratio attains a peak value in the range of 60 to 80 Å, and by using a CoFe magnetic layer, a maximum resistance change ratio of 6.5% is obtained.

Figure 11:
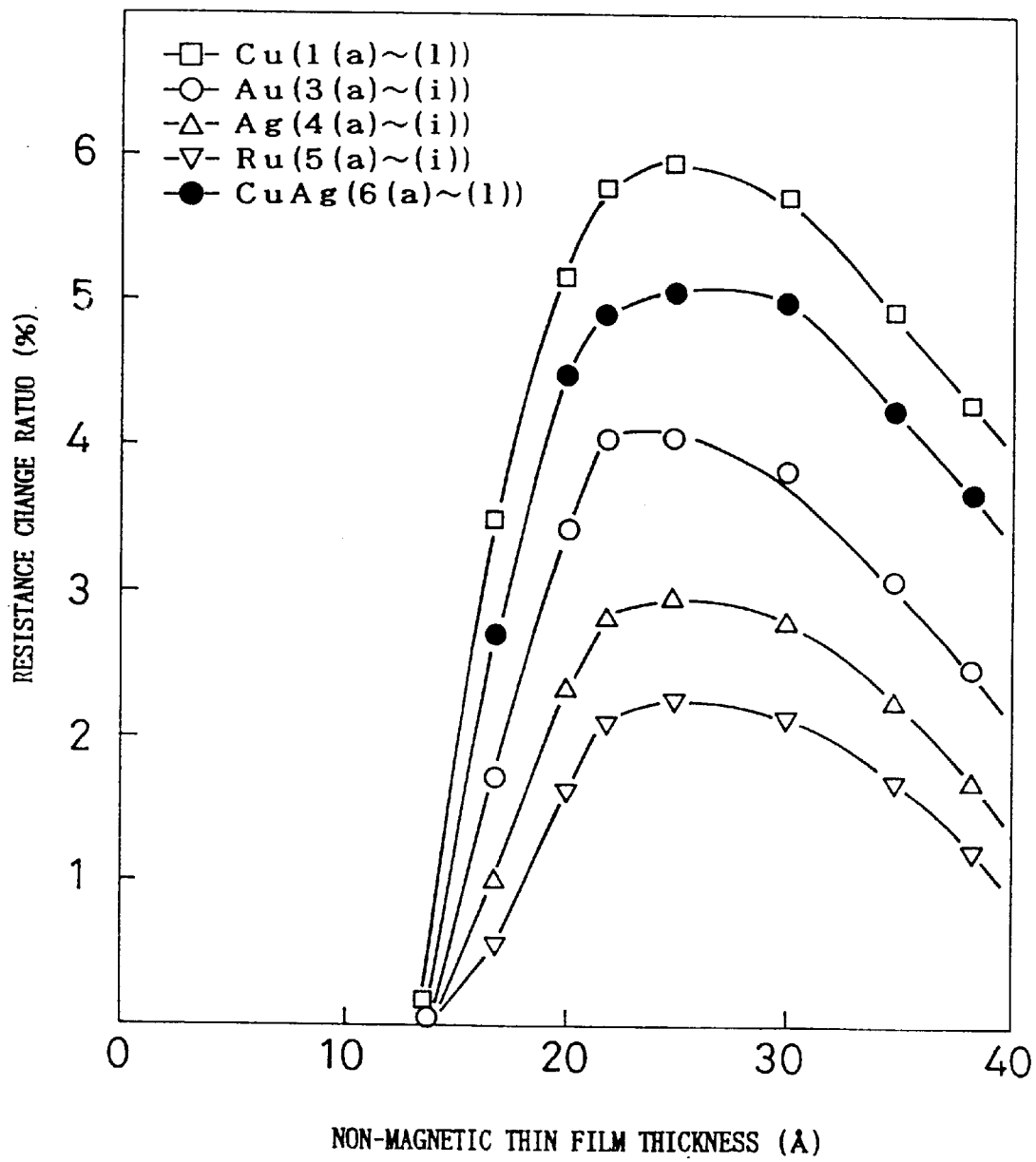
FIG. 11 is a graph which shows the relationship between the resistance change ratio and the antiferromagnetic thin film thickness of a magnetoresistive effect film according to the present invention.

FIG. 11 is a graph which shows the relationship between the resistance change ratio and the non-magnetic thin film thickness.

The resistance change ratio is maximum when the non-magnetic thin film thickness is 25 to 30 Å, and it can be seen that with a reduction in the thickness of the non-magnetic thin film, there is a significant reduction in the resistance change ratio.

Figure 12:
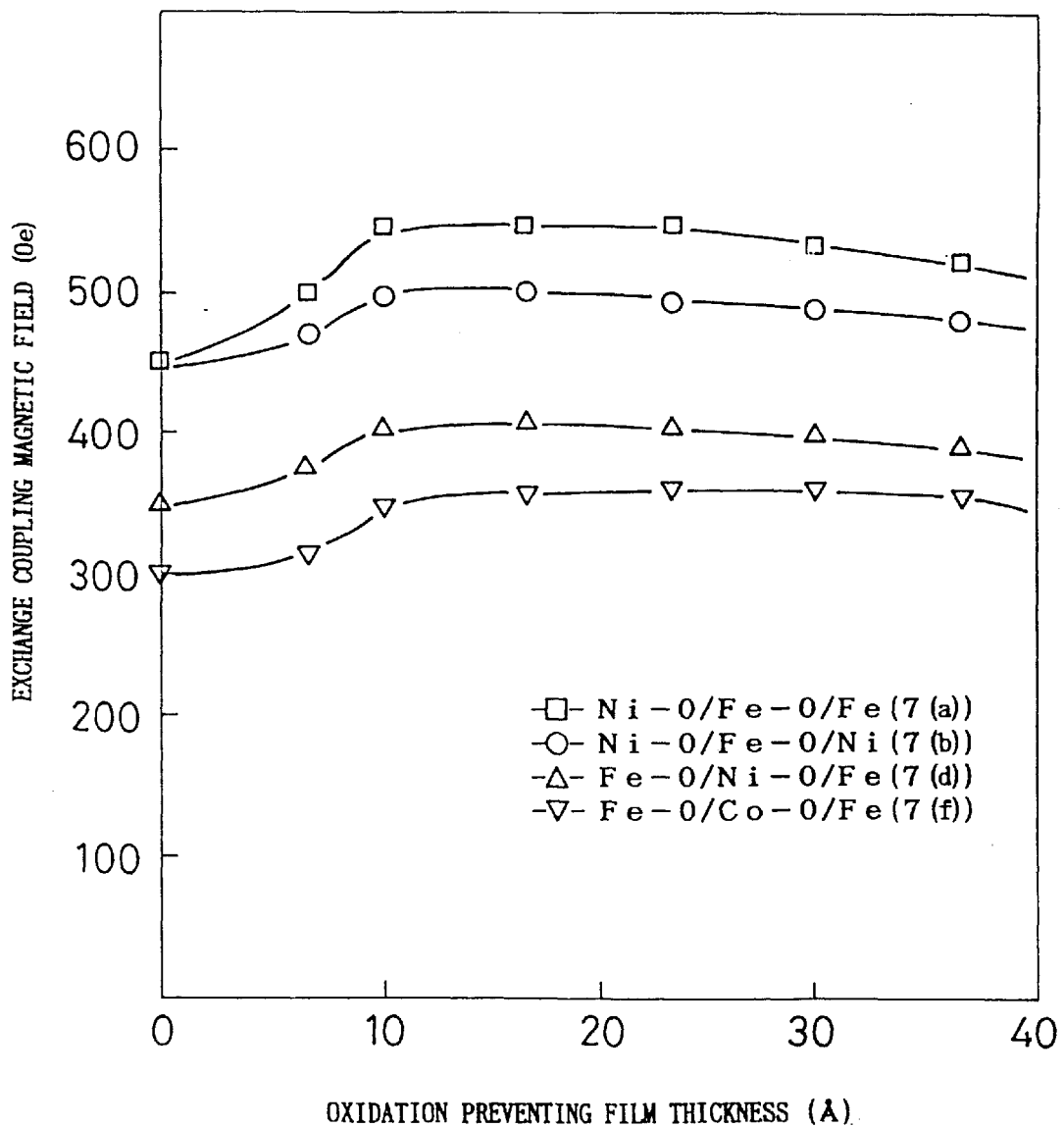
FIG. 12 is a graph which shows the relationship of exchange coupling magnetic field and the oxidation prevention film thickness of a magnetoresistive effect film according to the present invention.

FIG. 12 is a graph which shows the relationship between the exchange coupling magnetic field and the thickness of the oxidation preventing layer after heat treating at 260° C.

The reduction in the exchange coupling magnetic field is suppressed by forming an oxidation preventing layer, and at a thickness of 10 to 30 Å, this is predicted to be a value of 350 to 550 Oe.

Figure 13:
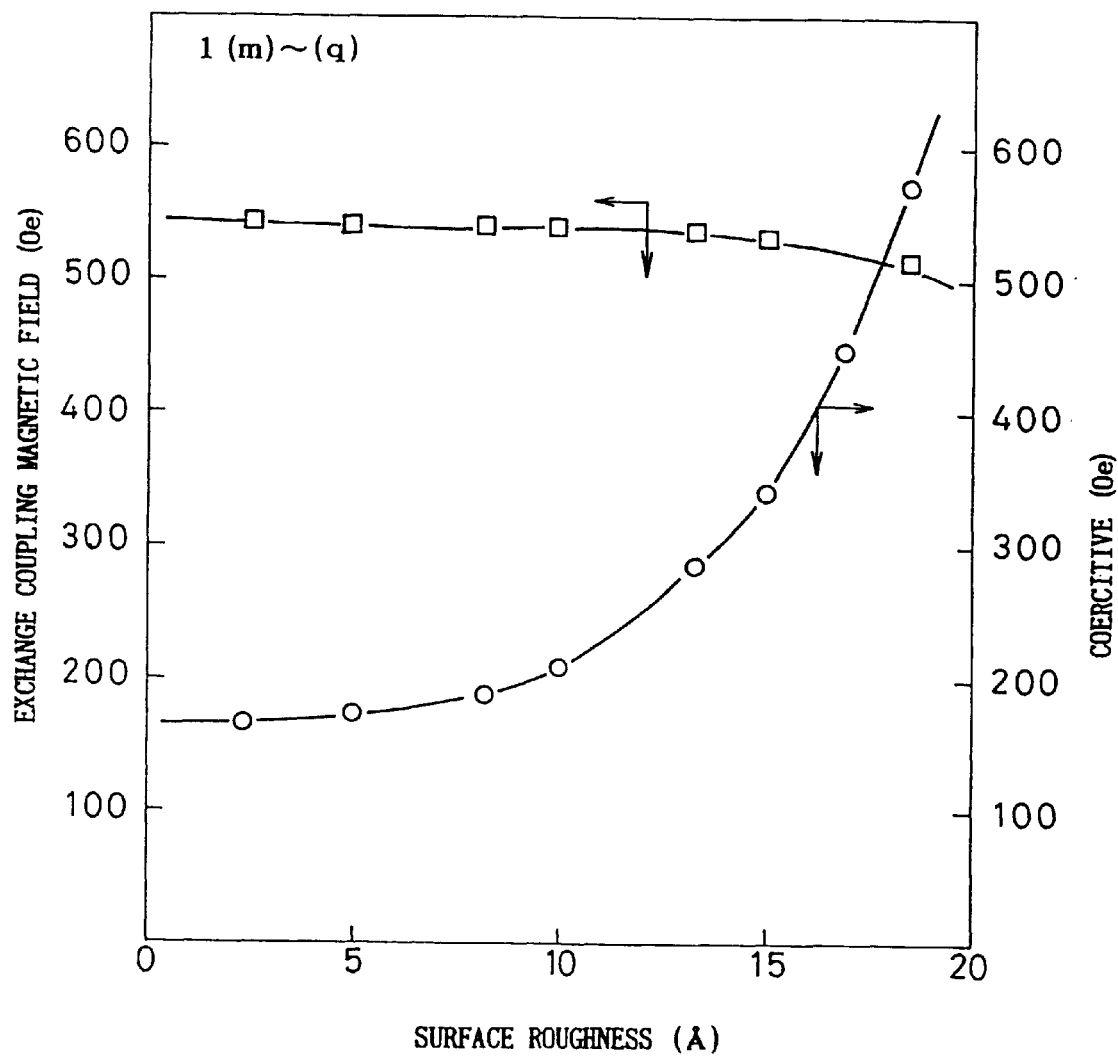
FIG. 13 is a graph which shows the relationship between the exchange coupling magnetic field, the coercivity, and the antiferromagnetic thin film surface roughness in a magnetoresistive effect film according to the present invention.

FIG. 13 is a graph that shows the relationship between the exchange coupling magnetic field, the coercivity, and the oxide antiferromagnetic thin film surface roughness.

While there is no correlation between the exchange coupling magnetic field and the surface roughness, the coercivity is greatly influenced by the surface roughness, and at a surface roughness of 2 to 15 Å, MR characteristics having little hysteresis are obtained.

Figure 14:
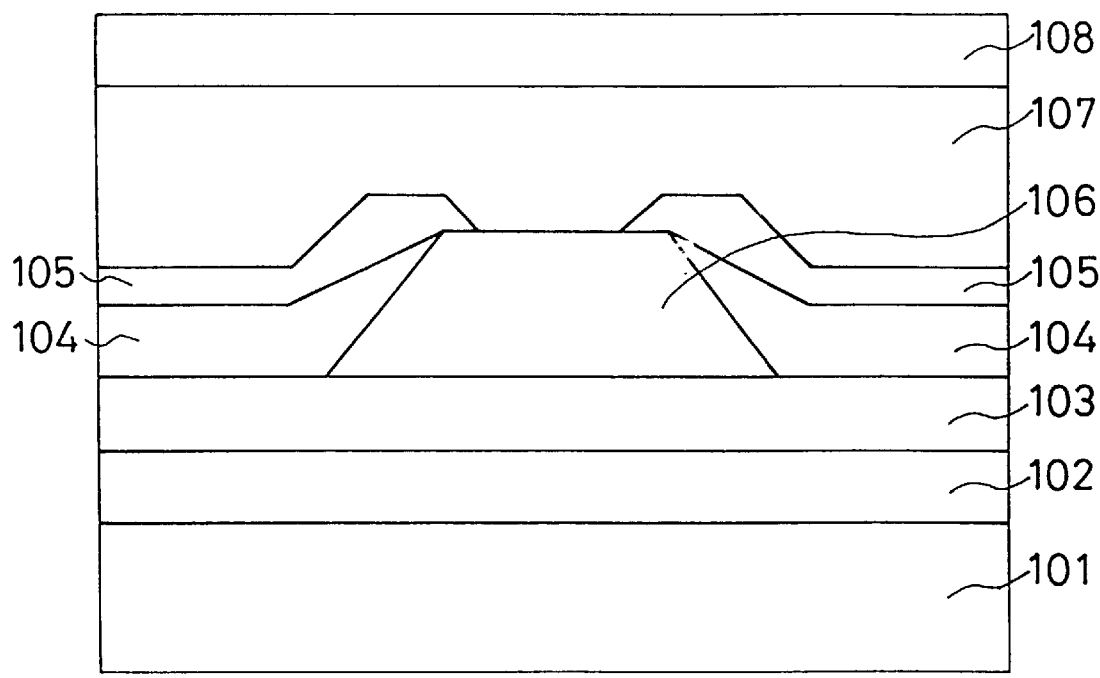
FIG. 14 is a simplified cross-sectional view which shows a magnetoresistive effect element according to the present invention.

FIG. 14 is a simplified cross-sectional view of a magnetoresistive effect element that is an embodiment of the present invention.

This magnetoresistive effect element is formed by upper and lower shield layers (102 and 108), laminated with insulating layers (103 and 107) therebetween, and then being patterned.

The artificial lattice (106) is neighbored by a permanent magnetic film (104), this causing the ferromagnetic thin film that detects the magnetic field to have a single magnetic domain.

Figure 15:
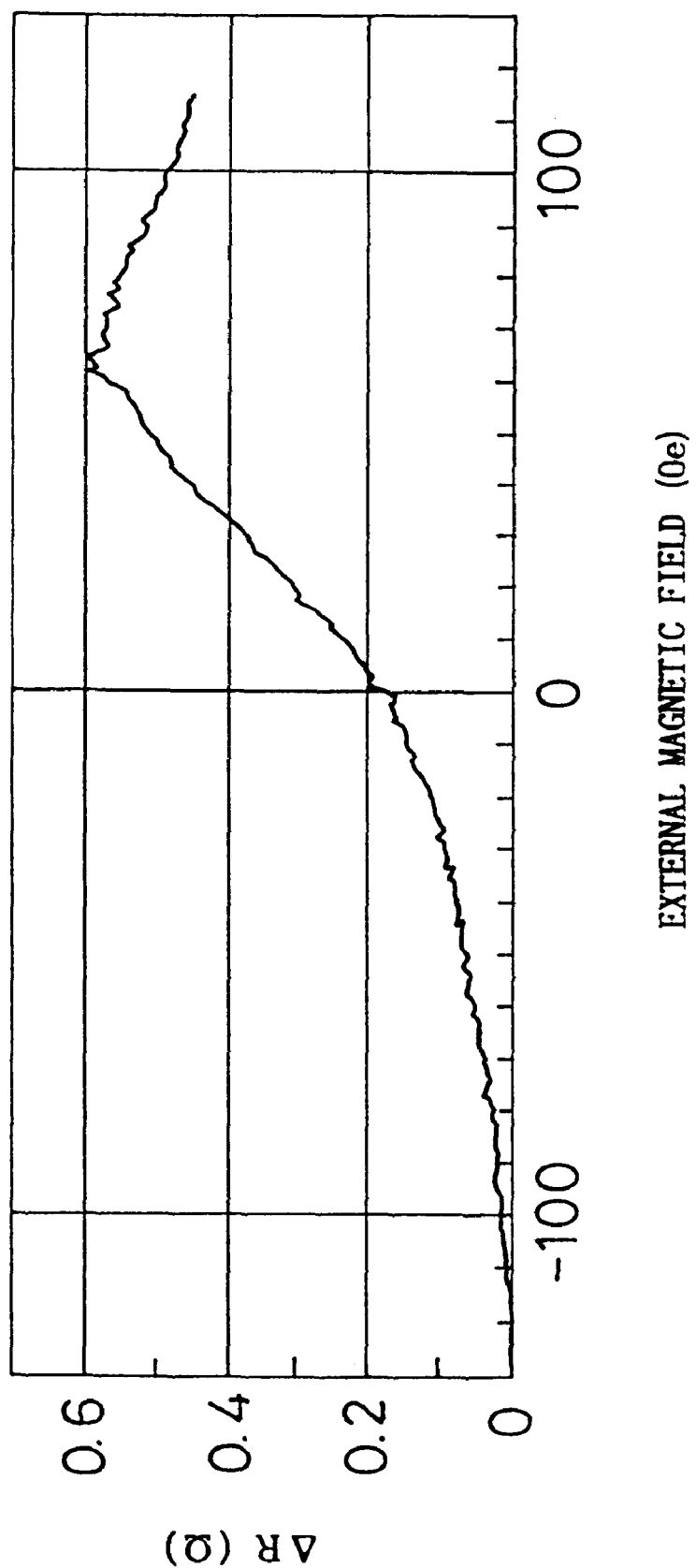
FIG. 15 is an MR curve which of a magnetoresistive effect element according to the present invention.

FIG. 15 is a graph which shows the MR curve of an element that is obtained in the case of a magnetoresistive effect film according to the present invention in which the element height is made to 1 μm and the element width is made to be 1.2 μm, and in which a CoCrPt permanent magnetic film is disposed so as to be adjacent as a magnetic domain stabilizing film.

By doing this, the magnetic domain is stabilized by the permanent magnetic film and not only is non-linear output such as from Barkhausen jump avoided, but also a six- to 10-fold increase in output is obtained in comparison to a usual anisotropic magnetoresistive effect.

Figure 5:
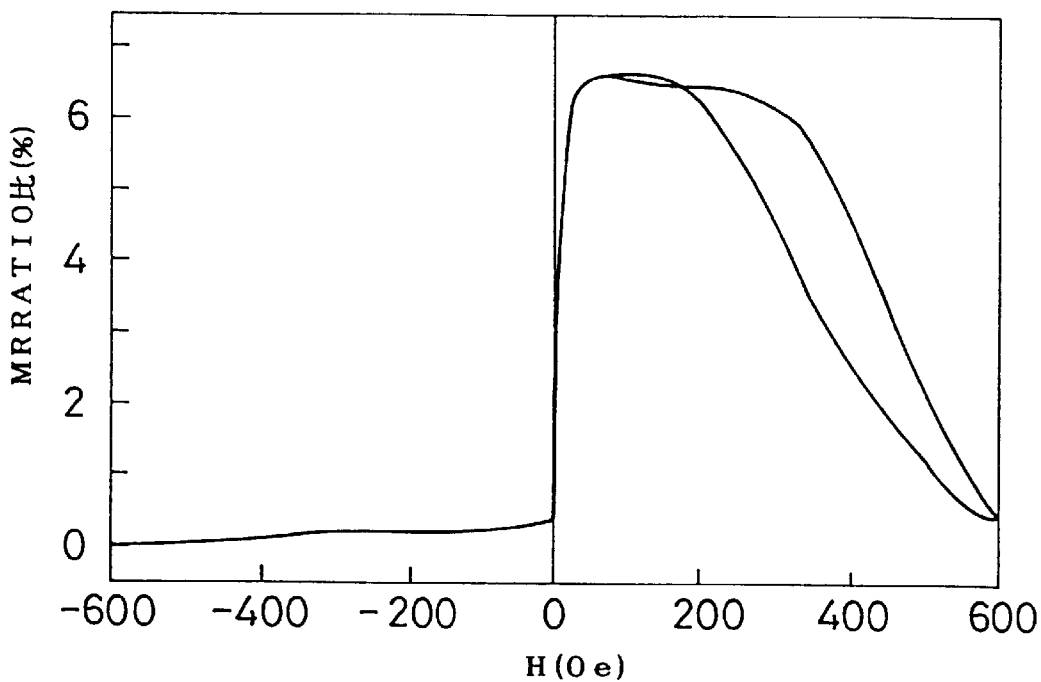
FIG. 5 is an MR curve of a magnetoresistive effect film according to the present invention.
Figure 6:
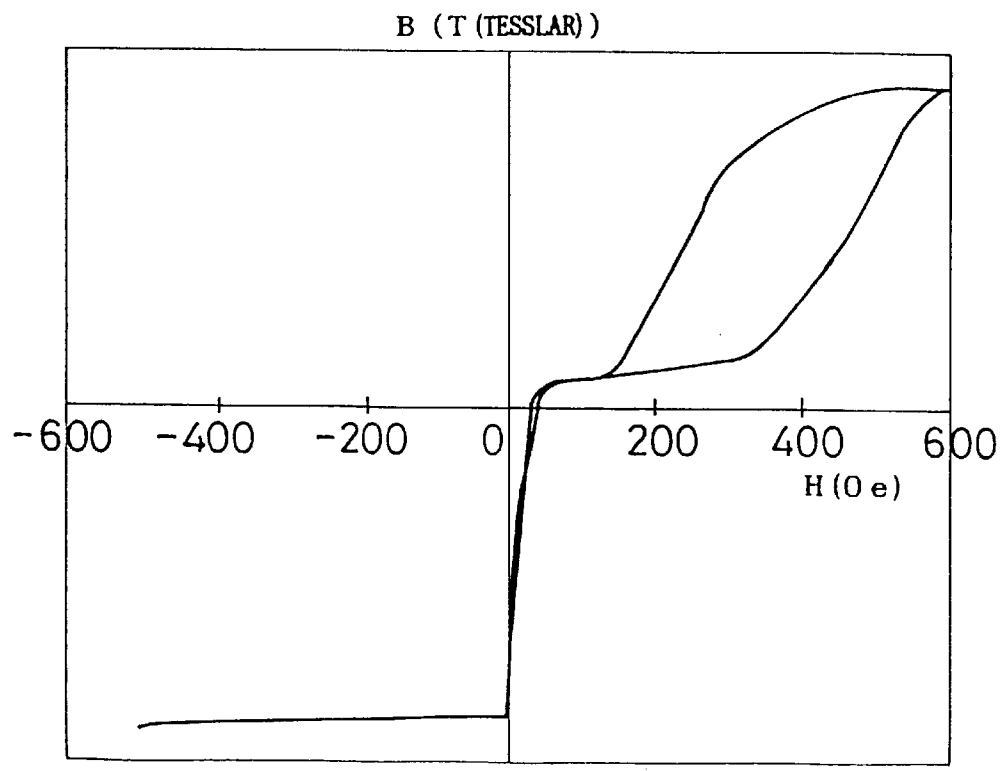
FIG. 6 is a B-H curve of a magnetoresistive effect film according to the present invention.

The B-H and MR curves of a magnetoresistive effect film according to the present invention are shown in FIG. 5 and in FIG. 6.

According to the present invention having the constitution described in detail above, it is possible to obtain a magnetoresistive effect film which has characteristics which exhibit a large linear change in resistance in the region of zero magnetic field and with respect to a small external magnetic field, which has good immunity to heat, and which also has improved manufacturability by means of controlling the heat treating temperature of the exchange coupling film.

What is claimed is:

1. A magnetoresistive effect element film comprising:
   two magnetic thin films with a nonmagnetic layer therebetween; and
   an antiferromagnetic structure immediately adjacent one of the two magnetic films, said structure comprising,
   two antiferromagnetic layers that are directly on one another, each of said two antiferromagnetic layers consisting of an antiferromagnetic material different than the antiferromagnetic material of the other antiferromagnetic layer, each of the two layers having a different Neel temperature, said antiferromagnetic materials for the two layers being selected from a group consisting of CrMn, FeMn, IrMn, CoMn, CuMn, PtMn, PdMn, RhMn, NiMn, and an alloy composed of two or more thereof.

2. The film of claim 1, wherein said antiferromagnetic materials for the two layers is selected from a group consisting of NiMn in a first one of the two layers and one of CoMn, CrMn, CuMn, and IrMn in a second one of the two layers, and IrMn in a first one of the two layers and one of PtMn and PdMn in a second one of the two layers.

3. A magnetoresistive effect element film comprising:
   two magnetic thin films with a nonmagnetic layer therebetween; and
   an antiferromagnetic structure immediately adjacent one of the two magnetic films, said structure comprising,
   two antiferromagnetic layers that are directly on one another, each of said two antiferromagnetic layers consisting of an antiferromagnetic material different than the antiferromagnetic material of the other antiferromagnetic layer, each of the two layers having a different Neel temperature, said antiferromagnetic materials for the two layers being selected from a group consisting of cobalt oxide, a nickel oxide, an α-phase iron oxide, and an alloy made from two or more thereof.

4. A method of making a magnetoresistive effect element film comprising the steps of:

placing a nonmagnetic layer between two magnetic thin films;

placing an antiferromagnetic structure immediately adjacent one of the two magnetic films, the structure being made by, placing two antiferromagnetic layers directly on one another, each of said two antiferromagnetic layers consisting of an antiferromagnetic material different than the antiferromagnetic material of the other antiferromagnetic layer, each of the two layers having a different Neel temperature, the antiferromagnetic materials for the two layers being selected from a group consisting of CrMn, FeMn, IrMn, CoMn, CuMn, PtMn, PdMn, RhMn, NiMn, and an alloy composed of two or more thereof.

5. The method of claim 4, wherein the antiferromagnetic materials for the two layers is selected from a group consisting of NiMn in a first one of the two layers and one of CoMn, CrMn, CuMn, and IrMn in a second one of the two layers, and IrMn in a first one of the two layers and one of PtMn and PdMn in a second one of the two layers.

6. A method of making a magnetoresistive effect element film comprising the steps of:

placing a nonmagnetic layer between two magnetic thin films; and placing an antiferromagnetic structure immediately adjacent one of the two magnetic films, the structure being made by, placing two antiferromagnetic layers directly on one another, each of said two antiferromagnetic layers consisting of an antiferromagnetic material different than the antiferromagnetic material of the other antiferromagnetic layer, each of the two layers having a different Neel temperature, said antiferromagnetic materials for the two layers being selected from a group consisting of cobalt oxide, a nickel oxide, an $\alpha$-phase iron oxide, and an alloy made from two or more thereof.

* * * * *